United States Patent
Koladi et al.

(10) Patent No.: US 10,515,682 B2
(45) Date of Patent: Dec. 24, 2019

(54) SYSTEM AND METHOD FOR MEMORY FAULT RESILIENCY IN A SERVER USING MULTI-CHANNEL DYNAMIC RANDOM ACCESS MEMORY

(71) Applicant: DELL PRODUCTS, LP, Round Rock, TX (US)

(72) Inventors: Krishnaprasad Koladi, Whitefield Bengaluru (IN); David K. Chalfant, Round Rock, TX (US); Jagadeesha Bollandoor, Bangalore (IN); Swamy Kadaba, Round Rock, TX (US)

(73) Assignee: Dell Products, LP, Round Rock, TX (US)

(*) Notice: Subject to any disclaimer, the term of this patent is extended or adjusted under 35 U.S.C. 154(b) by 0 days.

(21) Appl. No.: 15/924,909

(22) Filed: Mar. 19, 2018

(65) Prior Publication Data

US 2019/0287607 A1 Sep. 19, 2019

(51) Int. Cl.
| | | |
|---|---|---|
| *G11C 11/406* | (2006.01) | |
| *G11C 7/10* | (2006.01) | |
| *G11C 11/4096* | (2006.01) | |
| *G06F 12/0868* | (2016.01) | |
| *G06F 11/16* | (2006.01) | |
| *H01L 27/108* | (2006.01) | |

(52) U.S. Cl.
CPC ...... *G11C 11/40603* (2013.01); *G11C 7/1051* (2013.01); *G11C 11/4096* (2013.01); *G06F 11/1666* (2013.01); *G06F 12/0868* (2013.01); *H01L 27/108* (2013.01)

(58) Field of Classification Search
CPC ............ G11C 11/40603; G11C 7/1051; G11C 11/4096
USPC .................................................... 365/189.05
See application file for complete search history.

(56) References Cited

U.S. PATENT DOCUMENTS

| | | | |
|---|---|---|---|
| 9,471,231 B2 | 10/2016 | Bollandoor et al. | |
| 9,519,503 B2 | 12/2016 | Paul et al. | |
| 2005/0149548 A1* | 7/2005 | Chong, Jr. | .......... G06F 11/1466 |
| 2014/0059311 A1* | 2/2014 | Oberhofer | ............... G06F 3/061 |
| | | | 711/162 |
| 2016/0140039 A1* | 5/2016 | Sodani | ................ G06F 12/0646 |
| | | | 711/119 |

* cited by examiner

*Primary Examiner* — Anthan Tran
(74) *Attorney, Agent, or Firm* — Larson Newman, LLP

(57) ABSTRACT

An on-package multi-channel dynamic random access memory stores data associated with write requests. An off-package memory stores a copy of the data associated with the write requests. A resiliency driver detects a write request, stores data for the write request to the on-package multi-channel dynamic random access memory as a primary image, stores a backup of the data for the write request to the off-package memory as a secondary image, detects a read request, and reads data for the read request from the on-package multi-channel dynamic random access memory as the primary image.

17 Claims, 7 Drawing Sheets

SYSTEM AND METHOD FOR MEMORY FAULT RESILIENCY IN A SERVER USING MULTI-CHANNEL DYNAMIC RANDOM ACCESS MEMORY

FIELD OF THE DISCLOSURE

The present disclosure generally relates to information handling systems, and more particularly relates to memory fault resiliency in a server using on-package multi-channel dynamic random access memory.

BACKGROUND

As the value and use of information continues to increase, individuals and businesses seek additional ways to process and store information. One option is an information handling system. An information handling system generally processes, compiles, stores, or communicates information or data for business, personal, or other purposes. Technology and information handling needs and requirements can vary between different applications. Thus information handling systems can also vary regarding what information is handled, how the information is handled, how much information is processed, stored, or communicated, and how quickly and efficiently the information can be processed, stored, or communicated. The variations in information handling systems allow information handling systems to be general or configured for a specific user or specific use such as financial transaction processing, airline reservations, enterprise data storage, or global communications. In addition, information handling systems can include a variety of hardware and software resources that can be configured to process, store, and communicate information and can include one or more computer systems, graphics interface systems, data storage systems, networking systems, and mobile communication systems. Information handling systems can also implement various virtualized architectures. Data and voice communications among information handling systems may be via networks that are wired, wireless, or some combination.

SUMMARY

An information handling system may include an on-package multi-channel dynamic random access memory, an off-package memory, and a processor of a central processing unit. The on-package multi-channel dynamic random access memory may store data associated with write requests. The off-package memory may store a copy of the data associated with the write requests. The processor core may execute a resiliency driver. The resiliency driver may detect a write request, may store data for the write request to the on-package multi-channel dynamic random access memory as a primary image, may store a backup of the data for the write request to the off-package memory as a secondary image, may detect a read request, and may read data for the read request from the on-package multi-channel dynamic random access memory as the primary image.

BRIEF DESCRIPTION OF THE DRAWINGS

It will be appreciated that for simplicity and clarity of illustration, elements illustrated in the Figures are not necessarily drawn to scale. For example, the dimensions of some elements may be exaggerated relative to other elements. Embodiments incorporating teachings of the present disclosure are shown and described with respect to the drawings herein, in which.

The use of the same reference symbols in different drawings indicates similar or identical items.

DETAILED DESCRIPTION OF THE DRAWINGS

The following description in combination with the Figures is provided to assist in understanding the teachings disclosed herein. The description is focused on specific implementations and embodiments of the teachings, and is provided to assist in describing the teachings. This focus should not be interpreted as a limitation on the scope or applicability of the teachings.

Figure 1:
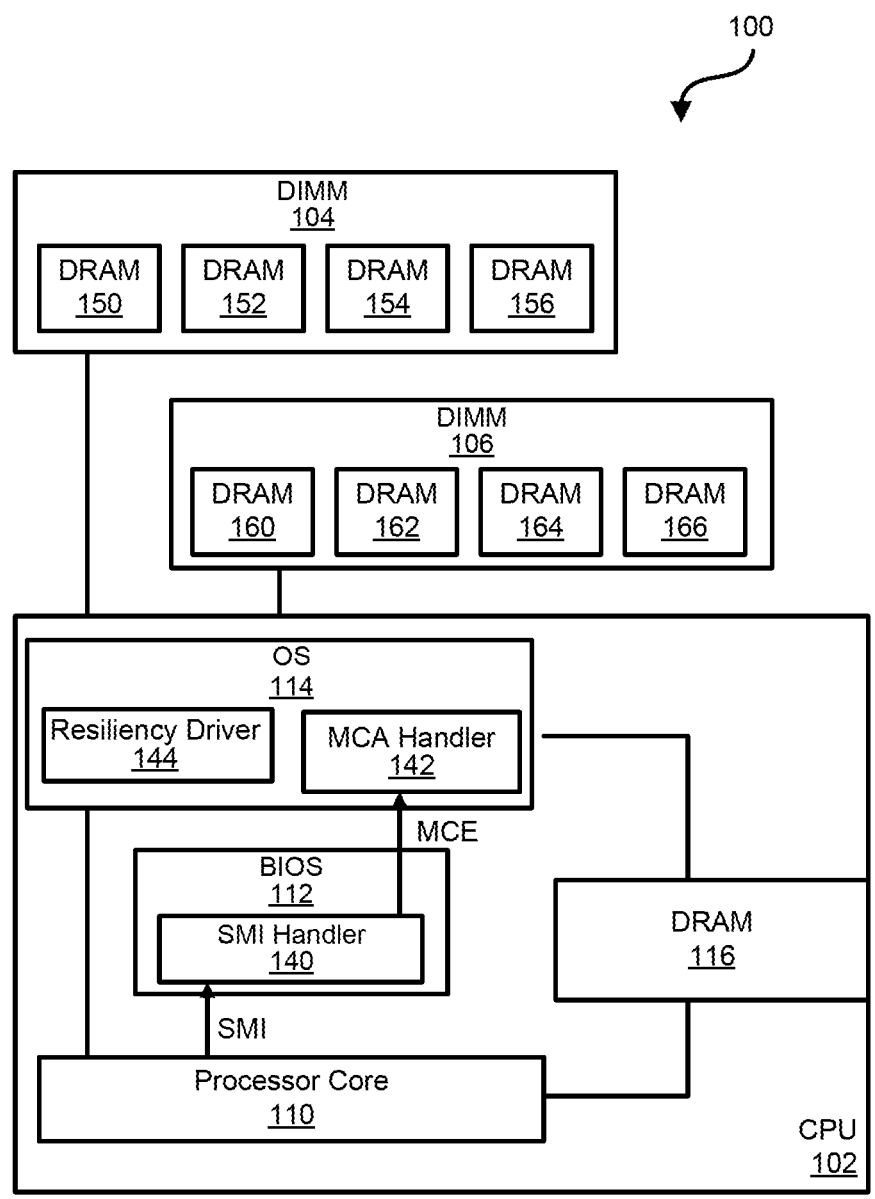
FIG. 1 is block diagram of a system including an information handling system according to at least one embodiment of the disclosure.

FIG. 1 shows an information handling system 100 including central processing unit (CPU) 102. For purposes of this disclosure, an information handling system may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, entertainment, or other purposes. For example, an information handling system may be a personal computer, a PDA, a consumer electronic device, a network server or storage device, a switch router or other network communication device, or any other suitable device and may vary in size, shape, performance, functionality, and price. The information handling system may include memory, one or more processing resources such as a central processing unit (CPU) or hardware or software control logic. Additional components of the information handling system may include one or more storage devices, one or more communications ports for communicating with external devices as well as various other I/O devices, such as a keyboard, a mouse, and a video display. The information handling system may also include one or more busses operable to transmit communications between the various hardware components.

The information handling system 100 includes CPU 102 and dual in-line memory modules (DIMMs) 104 and 106. In an embodiment, the information handling system 102 can be a server, a personal computer, a laptop computer, or the like. The CPU 102 includes a processor core 110, a basic input/output system (BIOS) 112, an operating system (OS) 114, and a processor on-package dynamic random access memory (DRAM) 116. The BIOS 112 includes a system management interrupt (SMI) handler 140. In an embodiment, the SMI handler 140 can be a firmware process executed by the CPU 102. The OS 114 includes a machine check architecture (MCA) handler 142 and a resiliency driver 144. The DIMM 104 includes multiple DRAMs 150, 152, 154, and 156 (150-156). The DIMM 106 includes multiple DRAMs 160, 162, 164, and 166 (160-166). In an embodiment, DIMMs 104 and 106 can be assigned with processor core 110.

In an embodiment, the MCA handler 142 can be a process in which the CPU 102 reports hardware errors, such as errors in DIMM 104 or 106 or on-package DRAM 116, to the OS 114. In an embodiment, the resiliency driver 144 can be a custom process or driver that is OS/hypervisor compatible, is complied for various OS versions, and is supported by a service module within the information handling system. In an embodiment, the service module can be an integrated remote access controller (iSM), an open manage server administrator (OMSA) controller, or the like. In an embodiment, the iSM can be any type of integrated access controller, such as an integrated Dell remote access controller (iDRAC) or the like. In an embodiment, the errors in the DIMMs 104 and 106 and the on-package DRAM 116 can include error correction code (ECC) errors and/or parity errors associated with data stored within the DRAMs 150-156, 160-166, or the on-package DRAM 116.

The processor core 110 can operate to provide data and control interfaces to one or more DIMM, such as the DIMMs 104 and 106 in accordance with a particular memory architecture. For example, the processor core 110 and the off-package DIMMs 104 and 106 may operate in accordance with a Double-Data Rate (DDR) standard, such as a JEDEC DDR4 or DDR5 standard. The DRAM 116 may include additional high bandwidth, multi-channel dynamic random access memory (MCDRAM) located internally on the processor package itself. The processor can communicate with the DRAM, and can determine whether optional, high-bandwidth, on-package, MCDRAM is detected. If high-bandwidth, on-package memory is detected, the processor core 110 can then allocate the high-bandwidth, on-package, MCDRAM portion of the overall DRAM 116 to operate as a primary image for storing data during write requests. The processor core 110 can allocate the DIMMs 104 and 106 to operate as secondary images for the data of write requests.

The CPU 102 can perform memory mirroring between the on-package MCDRAM 116 and the DIMMs 104 and 106. However, current CPUs do not provide any level of hardware support for mirroring, such that fault resilient memory for the CPU is not available is current CPUs. Therefore, CPU 102 provides an improvement over current CPUs by providing the resiliency driver 144 to implement fault resiliency memory for the CPU 102.

During operation of the information handling system 100, an iSM/OMSA user interface can provide an option for a user of the information handling system 100 to enable memory resiliency. In response to the user enabling memory resiliency, the resiliency driver 144 is loaded within the OS 114. In an embodiment, the resiliency driver 144 is capable of hooking all memory read and write requests originating from the OS 114 or a hypervisor of the CPU 102. The resiliency driver 144 hooks all memory write requests by intercepting write requests and send these requests to both the on-package MCDRAM 116 and to DIMM 104 or 106 to maintain coherency between the memories. In an embodiment, memory resiliency can be enabled on for individual write or read requests by a tag being added to the write or read request. In this embodiment, the resiliency driver 144 can intercept a write request, can process a tag identification (ID) for the write or read request. The resiliency driver 144 can then determine whether to mirror the data associated with a write request based on the tag ID.

In an embodiment, the resiliency driver 144 can direct all memory read requests from mirror region are directed to on-package MCDRAM 116 for performance improvement. In an embodiment, the performance improvement can result from the high speed interface with the on-package MCDRAM 116. In an embodiment, the on-package MCDRAM 116 can be configured between an amount of the on-package MCDRAM 116 utilized for storing data from write requests and an amount utilized as a cache, such as 25% for storage 75% for cache, 50% for storage and 50% for cache, 75% for storage and 25% for cache, or the like. In an embodiment, the resiliency driver 144 can make use of static resource affinity table (SRAT) to read memory ranges of the MCDRAM portion of the DRAM 116 so the resiliency driver 144 can direct read and write requests to the correct portion of the DRAM 116.

When the OS 114 issues a write request, the resiliency driver 144 can intercept the write request and can then issue a write of the data associated with the write request to the on-package MCDRAM 116 as the primary image. The CPU 102 can then perform an error check on the data stored to the on-package MCDRAM 116, and if no error is detected the resiliency driver 144 can issue a write to DIMM 104 or 106 as the secondary image. If an error is detected the processor core 110 can generate a system management interrupt (SMI) and provide the SMI to the SMI handler 140. In an embodiment, the error can be a memory uncorrected write error or the like. In an embodiment, the SMI handler 140 can determine that the SMI came from the processor core 110 and can determine a region of the on-package MCDRAM 116 that generated the SMI. The SMI handler 140 can then provide a machine check error (MCE) notification to the MCA handler 142 of the OS 114. In an embodiment, the MCE notification can include an Advanced Processor Interrupt Controller Identification (APIC ID) and region of the on-package MCDRAM 116 that caused the SMI. In an embodiment, the resiliency driver 144 may then retry writing the data for the write request to the on-package MCDRAM 116, or may issue a write to DIMM 104 or 106 as the secondary image without retrying the write to the on-package MCDRAM 116.

The CPU 102 can then perform an error check on the data stored to the DIMM 104 or 106. If an error is detected the processor core 110 can generate a SMI and provide the SMI to the SMI handler 140. In an embodiment, the SMI handler 140 can determine that the SMI came from the processor core 110 and can determine a region of the off-package DIMM 104 or 106 that generated the SMI. The SMI handler 140 can then provide a MCE notification to the MCA handler 142 of the OS 114. In an embodiment, the MCE notification can include an APIC ID and bank of the DIMM 104 or 106 that caused the SMI. In an embodiment, the resiliency driver 144 may then retry writing the data for the write request to the DIMM 104 or 106.

When the OS 114 issues a read request, the resiliency driver 144 can intercept the read request and can then issue a read of the data associated with the read request to the on-package MCDRAM 116 as the primary image. If correct or error correction code (ECC) corrected data is returned from the on-package MCDRAM 116, then the data read from the on-package MCDRAM 116 is provided to the OS 114. However, if uncorrected data is returned, then a SMI is generated by the CPU 102 and error correction is performed for the data. Upon the error correction being performed, the resiliency driver 144 can retry reading data from the on-package MCDRAM 116. The CPU 102 can then determine whether corrected data is returned, if so then the read data is provided to the OS 114. If uncorrected data is returned, then error correction on the data in the on-package MCDRAM 116 can be attempted again. This process of retrying to read the data from the on-package MCDRAM 116 and determining whether corrected data is returned can be repeated a predetermined number of times, at which point the resiliency driver 144 can attempt a read from DIMM 104 or 106 as the secondary image.

If correct or ECC corrected data is return from the DIMM 104 or 106, then the data read from the DIMM 104 or 106 is provided to the OS 114 and a mirror scrub is performed. In an embodiment, the mirror scrub can include the OS 114 writing correct data from the DIMM 104 or 106 to the on-package MCDRAM 116, such as overwriting the uncorrected data in the on-package MCDRAM 116 with the correct data from the DIMM 104 or 106. After the mirror scrub is completed, the CPU 102 can determine whether the on-package MCDRAM 116 now includes correct data. If the on-package MCDRAM 116 includes correct data, then the memory fault resiliency operations continue for future read and write requests. However, if the on-package MCDRAM 116 does not include correct data the resiliency driver 144 can trigger a redundancy loss mechanism, and can direct all future read and write requests to DIMM 104 or 106. In this situation, is can be expected that a user may bring the information handling system 100 down to resolve the persistent MCE behavior in the on-package MCDRAM 116. In an embodiment, the persistent MCE behavior can be resolved by replacing the CPU 102.

If uncorrected data is returned, then a SMI is generated by the CPU 102 and error correction is performed for the data. In an embodiment, the uncorrected data can be a result of both images, such as on-package MCDRAM 116 and DIMM 104 or 106, being corrupted, which can be identified as a persistent uncorrected error. A SMI can then be generated by the CPU 102 and error correction is performed for the data. In an embodiment, the processor core 110 can implement Enhanced Machine Check Architecture Generation 2 (eMCA Gen2), which can enable the processor core 110 to provide system management interrupts (SMI) to the SMI handler 140 of the BIOS 112 for uncorrected errors recorded in the DIMM 104 or 106. Then corrective actions can be taken, such as user notification via a base board management controller (BMC), or another service processor that operates in accordance with an Intelligent Platform Management Interface (IPMI), such as an integrated Dell Remote Access Controller (iDRAC) or the like. The corrective action can also include propagation of the MCE to the OS so that the MCA handler 142 can either perform recovery or graceful shutdown, such as blue screen or kernel panic.

Figure 2:
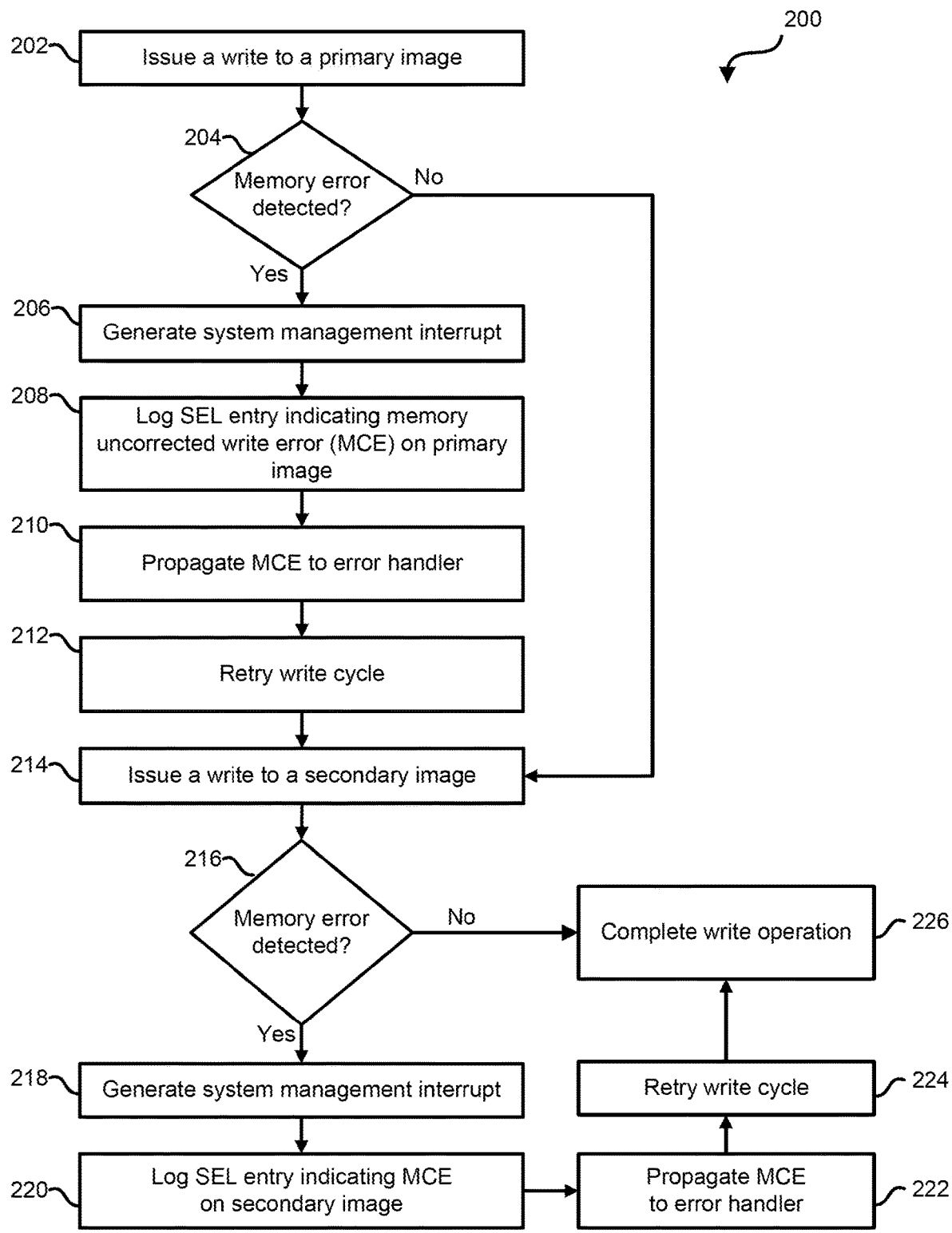
FIG. 2 is a flow diagram of a method for providing memory resiliency during a write operation of the information handling system according to at least one embodiment of the present disclosure.
Figure 3:
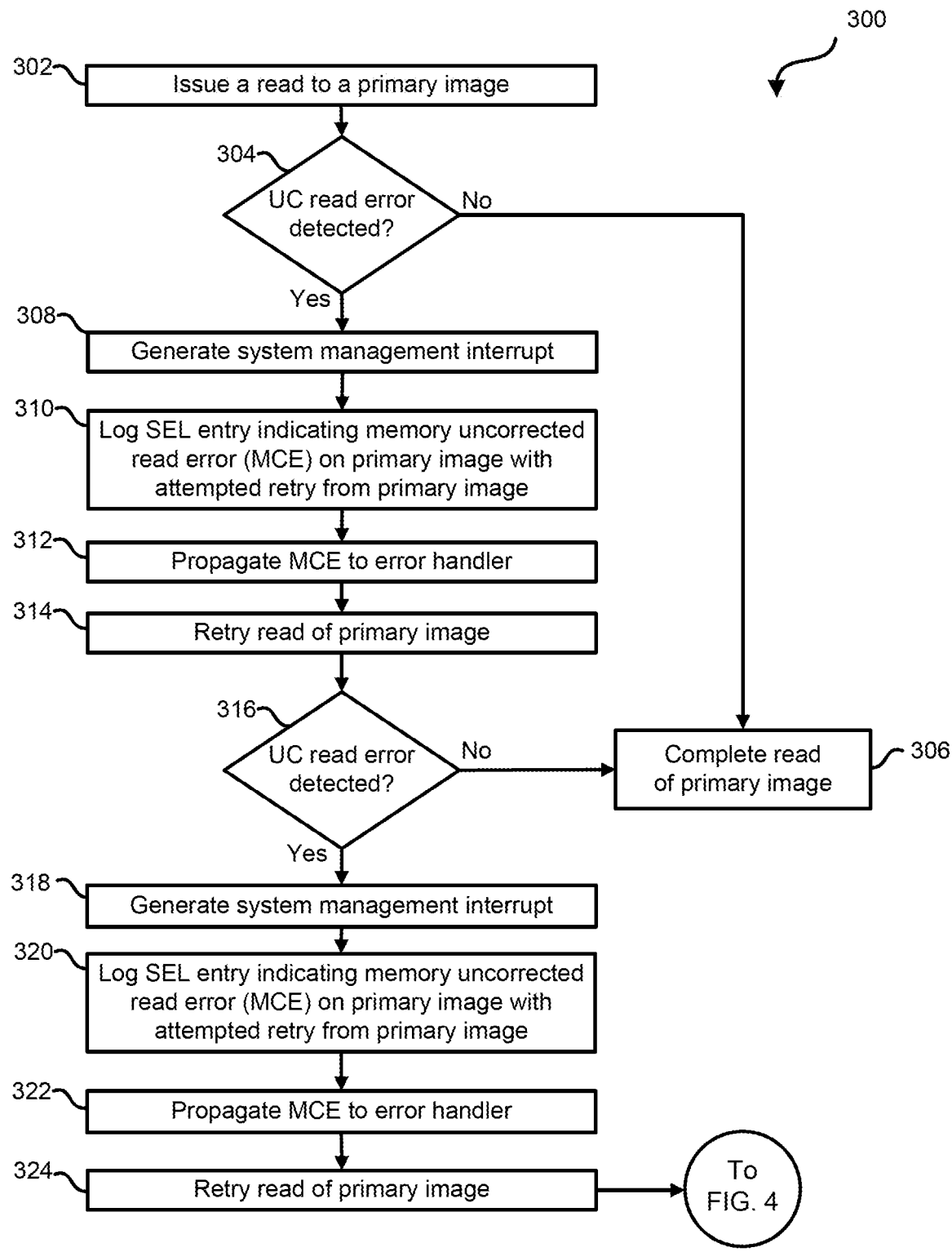
FIGS. 3-6 are a flow diagram of a method for providing memory resiliency during a read operation of the information handling system according to at least one embodiment of the present disclosure.

FIG. 2 illustrates a flow diagram of a method 200 for providing memory resiliency during a write operation of the information handling system according to at least one embodiment of the present disclosure. At block 202, a write is issued to a primary image. In an embodiment, this write can be issued by a resiliency driver after the driver intercepts a write request from an OS of a CPU. In an embodiment, the primary image can be a MCDRAM. At block 204, a determination is made whether a memory error is detected. If a memory error is not detected, the flow continues as stated below at block 214. However, if a memory error is detected, then a SMI is generated at block 206.

At block 208, a system event log (SEL) entry is logged indicating a memory uncorrected write error (MCE) on the primary image. In an embodiment, a SMI handler of a BIOS within the CPU can log the SEL entry. The MCE is propagated to an error handler at block 210. In an embodiment the error handler can be an OS MCA handler if the processor core implements eMCA Gen2. Otherwise, the error handler can be hardware with a dual signal being provided to SMI handler and MCE handler. At block 212, the write to the primary image is retried. In an embodiment, block 212 can be optional.

At block 214, a write to a secondary image is issued. In an embodiment, the secondary image can be a DIMM in communication with the CPU. At block 216, a determination is made whether a memory error is detected in the secondary image. If a memory error is not detected, the flow continues as stated below at block 226. However, if a memory error is detected, then a SMI is generated at block 218. At block 220, a SEL entry is logged indicating a MCE on the secondary image. The MCE is propagated to an error handler at block 222. At block 224, the write to the secondary image is retried. In an embodiment, block 224 can be optional. At block 226, the write operation is completed. In an embodiment, a redundancy loss is not triggered in response to memory errors in the primary or secondary images. Instead, the memory error can remain latent in memory until subsequent read cycle to that location.

FIGS. 3-6 are a flow diagram of a method for providing memory resiliency during a read operation of the information handling system according to at least one embodiment of the present disclosure. At block 302, a read is issued to a primary image. In an embodiment, this read can be issued by a resiliency driver after the driver intercepts a read request from the OS of the CPU. In an embodiment, the primary image can be a MCDRAM. At block 304, a determination is made whether an uncorrected (UC) read error is detected. If a UC read error is not detected, the read of the primary image is completed at block 306. However, if a UC read error is detected, then a SMI is generated at block 308.

At block 310, a SEL entry is logged indicating a MCE on the primary image. In an embodiment, a SMI handler of a BIOS within the CPU can log the SEL entry. The MCE is propagated to an error handler at block 312. In an embodiment, the error handler can be an OS MCA handler if the processor core implements eMCA Gen2. Otherwise, the error handler can be hardware with a dual signal being provided to SMI handler and MCE handler. At block 314, the read from the primary image is retried. At block 316, a determination is made whether a UC read error is detected. If a UC read error is not detected, the flow continues as stated above at block 306. However, if a UC read error is detected, then a SMI is generated at block 318. At block 320, a SEL entry is logged indicating a MCE on the primary image. The MCE is propagated to an error handler at block 322. At block 324, the read from the primary image is retried.

Figure 4:
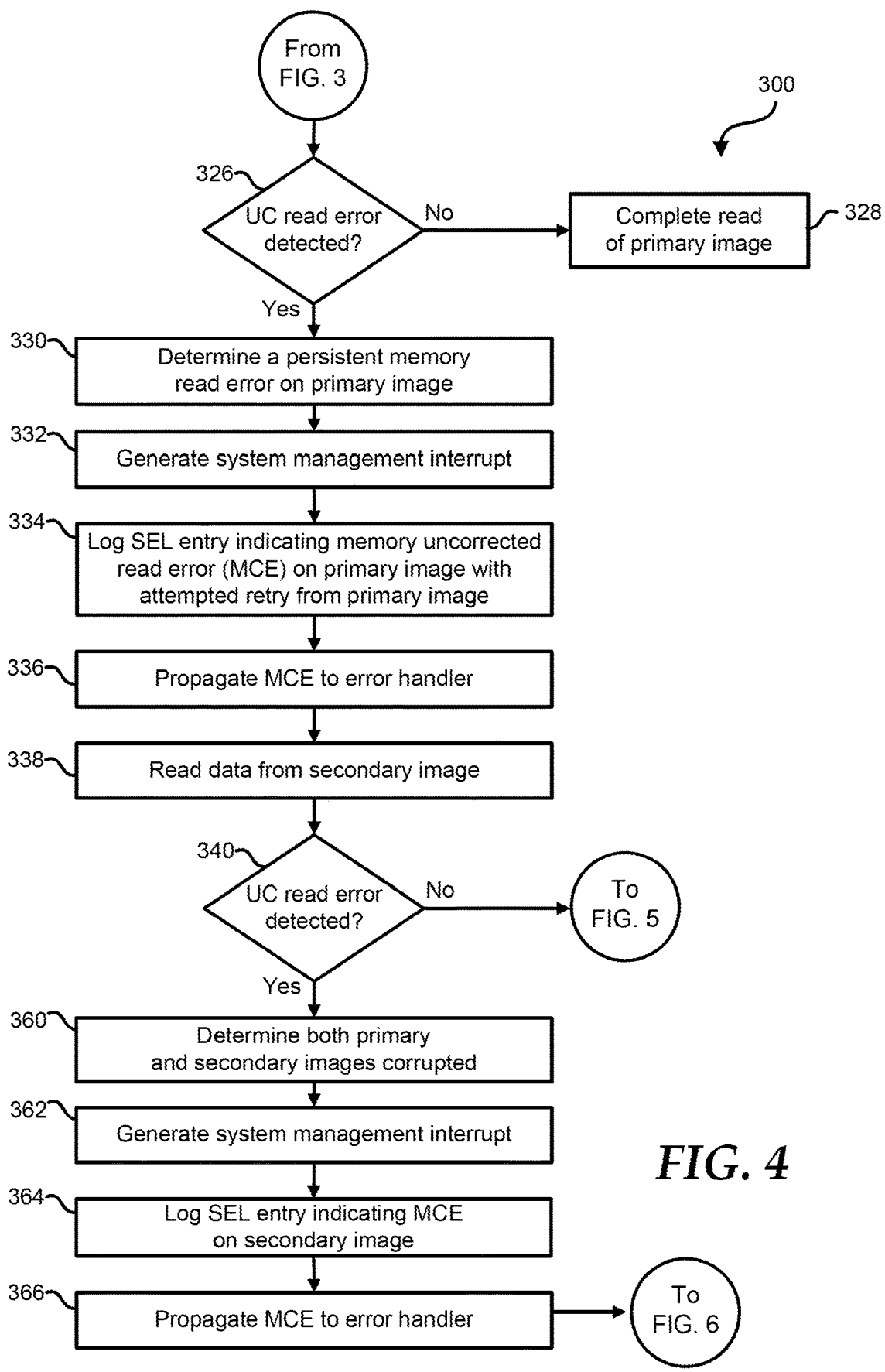

Referring now to FIG. 4, a determination is made whether a UC read error is detected at block 326. If a UC read error is not detected, the read of the primary image is completed at block 328. However, if a UC read error is detected, then a persistent memory read error is determined at block 330. A SMI is generated at block 332. At block 334, a SEL entry is logged indicating a MCE on the primary image. The MCE is propagated to an error handler at block 336.

At block 338, a read from a secondary image is issued. In an embodiment, the secondary image can be a DIMM in communication with the CPU. At block 340, a determination is made whether a UC read error is detected in the secondary image. If a memory error is detected, then the flow continues as stated below at block 360. However, if a memory error is not detected, the flow continues at block 342 in FIG. 5.

Figure 5:
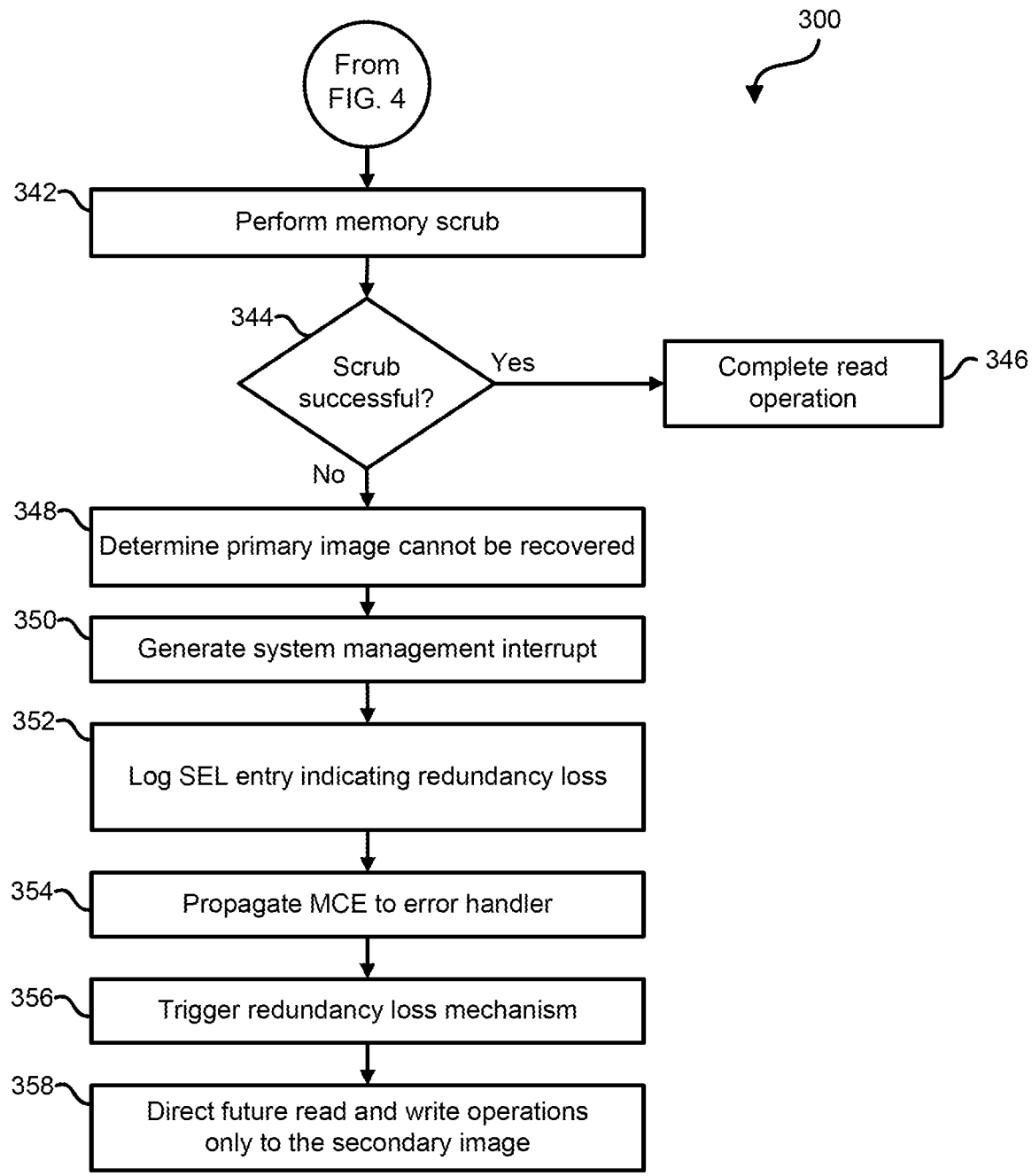

Referring now to FIG. 5, a memory scrub is performed at block 342. At block 344, a determination is made whether the memory scrub is successful. If the memory scrub is successful, the read operation is completed at block 346. However, if the memory scrub is not successful, a determination is made that the primary image cannot be recovered at block 348. At block 350, a SMI is generated. A SEL entry is logged indicating redundancy loss at block 352. The MCE is propagated to an error handler at block 354. At block 356, a redundancy loss mechanism is triggered. Future read and write operations are directed only to the secondary image at block 358.

Referring back to FIG. 4, if an UC read error is detected for the secondary image, a determination is made that both primary and secondary images are corrupted at block 360. At block 362, a SMI is generated. A SEL entry indicating MCE on the secondary image is logged at block 364. The MCE is propagated to an error handler at block 366.

Figure 6:
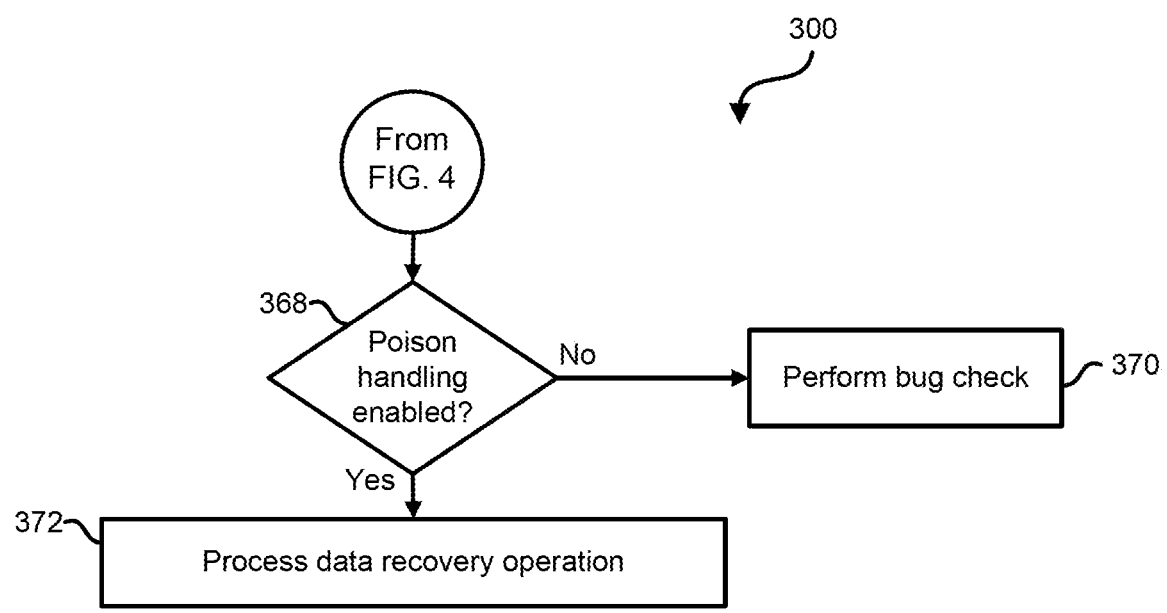

Referring now to FIG. 6, a determination is made whether poison handling is enabled at block 368. If poison handling is not enabled, a bug check is performed at block 370. However, if poison handling is enabled, a data recovery operation is processed at block 372.

Figure 7:
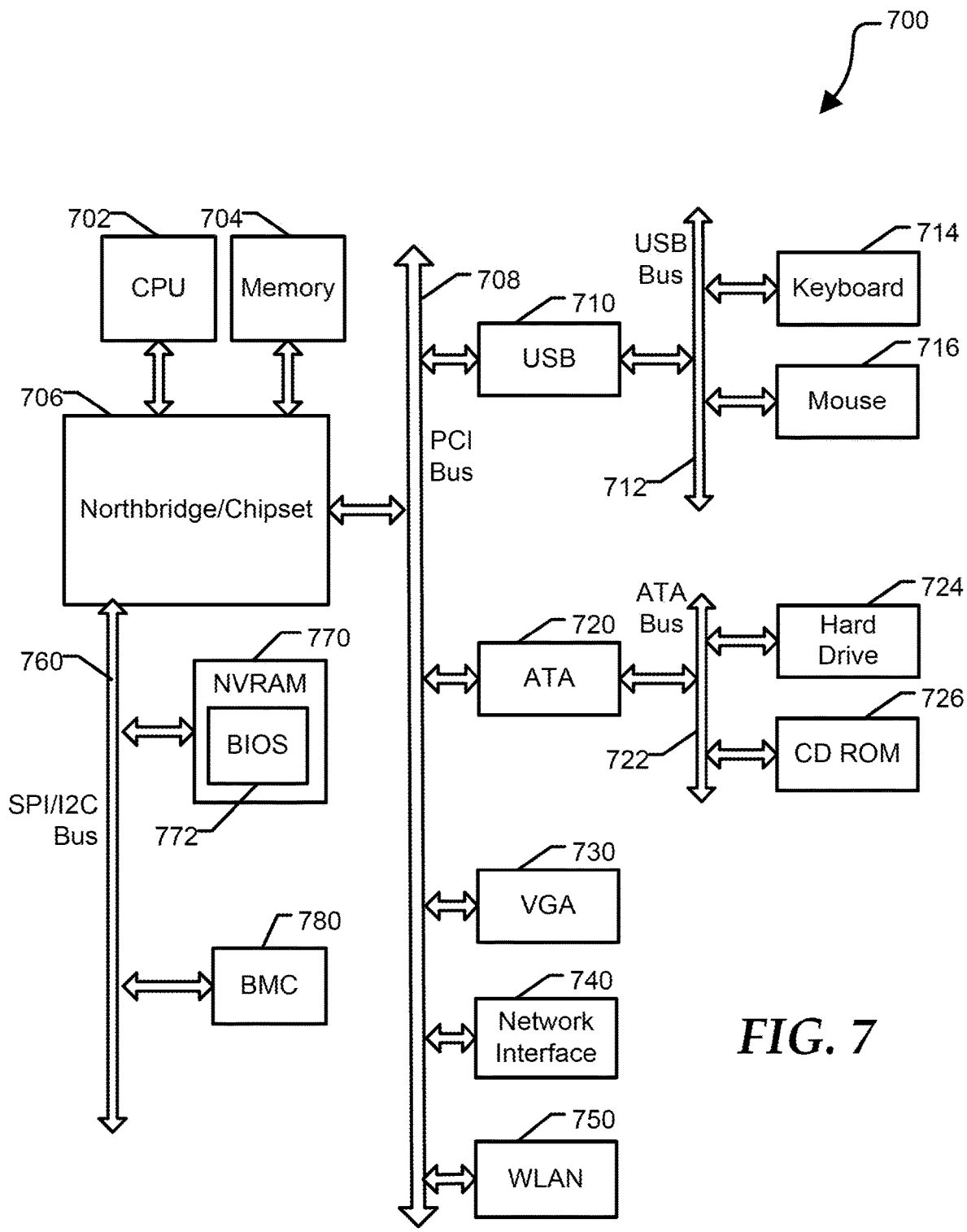
FIG. 7 is a block diagram of a general information handling system according to an embodiment of the present disclosure.

FIG. 7 illustrates a general information handling system 700 including a processor 702, a memory 704, a northbridge/chipset 706, a PCI bus 708, a universal serial bus (USB) controller 710, a USB 712, a keyboard device controller 714, a mouse device controller 716, a configuration an ATA bus controller 720, an ATA bus 722, a hard drive device controller 724, a compact disk read only memory (CD ROM) device controller 726, a video graphics array (VGA) device controller 730, a network interface controller (NIC) 740, a wireless local area network (WLAN) controller 750, a serial peripheral interface (SPI) bus 760, a NVRAM 770 for storing BIOS 772, and a baseboard management controller (BMC) 780. BMC 780 can be referred to as a service processor or embedded controller (EC). Capabilities and functions provided by BMC 780 can vary considerably based on the type of information handling system. For example, the term baseboard management system is often used to describe an embedded processor included at a server, while an embedded controller is more likely to be found in a consumer-level device. As disclosed herein, BMC 780 represents a processing device different from CPU 702, which provides various management functions for information handling system 700. For example, an embedded controller may be responsible for power management, cooling management, and the like. An embedded controller included at a data storage system can be referred to as a storage enclosure processor.

System 700 can include additional processors that are configured to provide localized or specific control functions, such as a battery management controller. Bus 760 can include one or more busses, including a SPI bus, an I2C bus, a system management bus (SMBUS), a power management bus (PMBUS), and the like. BMC 780 can be configured to provide out-of-band access to devices at information handling system 700. As used herein, out-of-band access herein refers to operations performed prior to execution of BIOS 772 by processor 702 to initialize operation of system 700.

BIOS 772 can be referred to as a firmware image, and the term BIOS is herein used interchangeably with the term firmware image, or simply firmware. BIOS 772 includes instructions executable by CPU 702 to initialize and test the hardware components of system 700, and to load a boot loader or an operating system (OS) from a mass storage device. BIOS 772 additionally provides an abstraction layer for the hardware, such as a consistent way for application programs and operating systems to interact with the keyboard, display, and other input/output devices. When power is first applied to information handling system 700, the system begins a sequence of initialization procedures. During the initialization sequence, also referred to as a boot sequence, components of system 700 are configured and enabled for operation, and device drivers can be installed. Device drivers provide an interface through which other components of the system 700 can communicate with a corresponding device.

Information handling system 700 can include additional components and additional busses, not shown for clarity. For example, system 700 can include multiple processor cores, audio devices, and the like. While a particular arrangement of bus technologies and interconnections is illustrated for the purpose of example, one of skill will appreciate that the techniques disclosed herein are applicable to other system architectures. System 700 can include multiple CPUs and redundant bus controllers. One or more components can be integrated together. For example, portions of northbridge/chipset 706 can be integrated within CPU 702. Additional components of information handling system 700 can include one or more storage devices that can store machine-executable code, one or more communications ports for communicating with external devices, and various input and output (I/O) devices, such as a keyboard, a mouse, and a video display. An example of information handling system 700 includes a multi-tenant chassis system where groups of tenants (users) share a common chassis, and each of the tenants has a unique set of resources assigned to them. The resources can include blade servers of the chassis, input/output (I/O) modules, Peripheral Component Interconnect-Express (PCIe) cards, storage controllers, and the like.

Information handling system 700 can include a set of instructions that can be executed to cause the information handling system to perform any one or more of the methods or computer based functions disclosed herein. The information handling system 700 may operate as a standalone device or may be connected to other computer systems or peripheral devices, such as by a network.

In a networked deployment, the information handling system 700 may operate in the capacity of a server or as a client user computer in a server-client user network environment, or as a peer computer system in a peer-to-peer (or distributed) network environment. The information handling system 700 can also be implemented as or incorporated into various devices, such as a personal computer (PC), a tablet PC, a set-top box (STB), a personal digital assistant (PDA), a mobile device, a palmtop computer, a laptop computer, a desktop computer, a communications device, a wireless telephone, a land-line telephone, a control system, a camera, a scanner, a facsimile machine, a printer, a pager, a personal trusted device, a web appliance, a network router, switch or bridge, or any other machine capable of executing a set of instructions (sequential or otherwise) that specify actions to be taken by that machine. In a particular embodiment, the computer system 700 can be implemented using electronic devices that provide voice, video or data communication. Further, while a single information handling system 700 is illustrated, the term "system" shall also be taken to include any collection of systems or sub-systems that individually or jointly execute a set, or multiple sets, of instructions to perform one or more computer functions.

The information handling system 700 can include a disk drive unit and may include a computer-readable medium, not shown in FIG. 7, in which one or more sets of instructions, such as software, can be embedded. Further, the instructions may embody one or more of the methods or logic as described herein. In a particular embodiment, the instructions may reside completely, or at least partially, within system memory 704 or another memory included at a system 700, and/or within the processor 702 during execution by the information handling system 700. The system memory 704 and the processor 702 also may include computer-readable media.

While the computer-readable medium is shown to be a single medium, the term "computer-readable medium" includes a single medium or multiple media, such as a centralized or distributed database, and/or associated caches and servers that store one or more sets of instructions. The term "computer-readable medium" shall also include any medium that is capable of storing, encoding, or carrying a set of instructions for execution by a processor or that cause a computer system to perform any one or more of the methods or operations disclosed herein.

In a particular non-limiting, exemplary embodiment, the computer-readable medium can include a solid-state memory such as a memory card or other package that houses one or more non-volatile read-only memories. Further, the computer-readable medium can be a random access memory or other volatile re-writable memory. Additionally, the computer-readable medium can include a magneto-optical or optical medium, such as a disk or tapes or other storage device to store information received via carrier wave signals such as a signal communicated over a transmission medium. Furthermore, a computer readable medium can store information received from distributed network resources such as from a cloud-based environment. A digital file attachment to an e-mail or other self-contained information archive or set of archives may be considered a distribution medium that is equivalent to a tangible storage medium. Accordingly, the disclosure is considered to include any one or more of a computer-readable medium or a distribution medium and other equivalents and successor media, in which data or instructions may be stored.

When referred to as a "device," a "module," or the like, the embodiments described herein can be configured as hardware. For example, a portion of an information handling system device may be hardware such as, for example, an integrated circuit (such as an Application Specific Integrated Circuit (ASIC), a Field Programmable Gate Array (FPGA), a structured ASIC, or a device embedded on a larger chip), a card (such as a Peripheral Component Interface (PCI) card, a PCI-express card, a Personal Computer Memory Card International Association (PCMCIA) card, or other such expansion card), or a system (such as a motherboard, a system-on-a-chip (SoC), or a stand-alone device).

The device or module can include software, including firmware embedded at a device or software capable of operating a relevant environment of the information handling system. The device or module can also include a combination of the foregoing examples of hardware or software. Note that an information handling system can include an integrated circuit or a board-level product having portions thereof that can also be any combination of hardware and software.

Devices, modules, resources, or programs that are in communication with one another need not be in continuous communication with each other, unless expressly specified otherwise. In addition, devices, modules, resources, or programs that are in communication with one another can communicate directly or indirectly through one or more intermediaries.

Although only a few exemplary embodiments have been described in detail herein, those skilled in the art will readily appreciate that many modifications are possible in the exemplary embodiments without materially departing from the novel teachings and advantages of the embodiments of the present disclosure. Accordingly, all such modifications are intended to be included within the scope of the embodiments of the present disclosure as defined in the following claims. In the claims, means-plus-function clauses are intended to cover the structures described herein as performing the recited function and not only structural equivalents, but also equivalent structures.

What is claimed is:

1. An information handling system comprising:
    an on-package multi-channel dynamic random access memory to store data associated with write requests;
    an off-package memory to store a copy of the data associated with the write requests; and
    a processor core of a central processing unit to communicate with the on-package multi-channel dynamic random access memory and with the off-package memory, the processor core to execute a resiliency driver, the resiliency driver to detect a write request, to store data for the write request to the on-package multi-channel dynamic random access memory as a primary image, to store a backup of the data for the write request to the off-package memory as a secondary image, to detect a read request, and to read data for the read request from the on-package multi-channel dynamic random access memory as the primary image;
    wherein the resiliency driver to determine whether a persistent memory read error has occurred on the on-package multi-channel dynamic random access memory while the data for the read request is being read from the on-package multi-channel dynamic random access memory, if the persistent memory read error has occurred, the resiliency driver to read the data for the read request from the off-package memory.

2. The information handling system of claim 1, the resiliency driver to determine whether the data read from the off-package memory is correct, if the data read from the off-package memory is correct, the resiliency driver to perform a mirror scrub to write the correct data from the off-package memory to the on-package multi-channel dynamic random access memory.

3. The information handling system of claim 2, wherein the correct data from the off-package memory is overwritten on corrupted data of the on-package multi-channel dynamic random access memory during the mirror scrub.

4. The information handling system of claim 2, the resiliency driver to determine whether the mirror scrub is successful, if the mirror scrub is not successful, the resiliency driver to direct future read and write request only to the off-package memory.

5. The information handling system of claim 1, wherein the off-package memory is a dual in-line memory module in communication with the processor core.

6. The information handling system of claim 1, wherein the on-package multi-channel dynamic random access memory is an on-chip memory for the central processing unit.

7. A method comprising:
    executing, by a processor of a central processing unit, a resiliency driver to perform mirroring between an on-package multi-channel dynamic random access memory and an off-package memory;
    detecting, by the resiliency driver, a write request;

storing, by the resiliency driver, data for the write request to the on-package multi-channel dynamic random access memory as a primary image;

storing, by the resiliency driver, a backup of the data for the write request to the off-package memory as a secondary image;

detecting, by the resiliency driver, a read request;

reading, by the resiliency driver, data for the read request from the on-package multi-channel dynamic random access memory as the primary image;

determining, by the resiliency driver, whether a persistent memory read error has occurred on the on-package multi-channel dynamic random access memory while the data for the read request is being read from the on-package multi-channel dynamic random access memory; and if the persistent memory read error has occurred, reading the data for the read request from the off-package memory.

8. The method of claim 7, further comprising:

determining, by the resiliency driver, whether the data read from the off-package memory is correct; and if the data read from the off-package memory is correct, performing a mirror scrub to write the correct data from the off-package memory to the on-package multi-channel dynamic random access memory.

9. The method of claim 8, wherein the correct data from the off-package memory is overwritten on corrupted data of the on-package multi-channel dynamic random access memory during the mirror scrub.

10. The method of claim 8, further comprising:

determining, by the resiliency driver, whether the mirror scrub is successful; and if the mirror scrub is not successful, the resiliency driver to direct future read and write request only to the off-package memory.

11. The method of claim 7, wherein the off-package memory is a dual in-line memory module in communication with the processor core.

12. The method of claim 7, wherein the on-package multi-channel dynamic random access memory is an on-chip memory for the central processing unit.

13. A method comprising:

executing a resiliency driver to perform mirroring between an on-package multi-channel dynamic random access memory and an off-package memory;

detecting, by the resiliency driver, a write request including a tag identification;

determining, by the resiliency driver, whether the write request is to be mirrored based on the tag identification; and in response to a determination that the write request is to be mirrored:

storing, by the resiliency driver, data for the write request to the on-package multi-channel dynamic random access memory as a primary image; and storing, by the resiliency driver, a backup of the data for the write request to the off-package memory as a secondary image;

detecting, by the resiliency driver, a read request;

reading data for the read request from the on-package multi-channel dynamic random access memory as the primary image;

determining, by the resiliency driver, whether a persistent memory read error has occurred on the on-package multi-channel dynamic random access memory while the data for the read request is being read from the on-package multi-channel dynamic random access memory: and if the persistent memory read error has occurred, reading the data for the read request from the off-package memory.

14. The method of claim 13, further comprising:

determining, by the resiliency driver, whether the data read from the off-package memory is correct; and if the data read from the off-package memory is correct, performing a mirror scrub to write the correct data from the off-package memory to the on-package multi-channel dynamic random access memory.

15. The method of claim 14, further comprising:

determining, by the resiliency driver, whether the mirror scrub is successful; and if the mirror scrub is not successful, the resiliency driver to direct future read and write request only to the off-package memory.

16. The method of claim 13, wherein the off-package memory is a dual in-line memory module in communication with the processor core.

17. The method of claim 13, wherein the on-package multi-channel dynamic random access memory is an on-chip memory for the central processing unit.

* * * * *